(12) United States Patent
Okandan et al.

(10) Patent No.: US 9,356,173 B2
(45) Date of Patent: May 31, 2016

(54) DYNAMICALLY RECONFIGURABLE PHOTOVOLTAIC SYSTEM

(71) Applicant: Sandia Corporation, Albuquerque, NM (US)

(72) Inventors: Murat Okandan, Edgewood, NM (US); Gregory N. Nielson, Albquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 317 days.

(21) Appl. No.: 14/014,266

(22) Filed: Aug. 29, 2013

(65) Prior Publication Data

US 2014/0060616 A1  Mar. 6, 2014

Related U.S. Application Data

(60) Provisional application No. 61/695,884, filed on Aug. 31, 2012.

(51) Int. Cl.
*H01L 31/02* (2006.01)
*B64G 1/44* (2006.01)
(Continued)

(52) U.S. Cl.
CPC .............. *H01L 31/042* (2013.01); *B64G 1/443* (2013.01); *H01L 31/02021* (2013.01); *H02J 7/35* (2013.01); *Y02E 10/50* (2013.01)

(58) Field of Classification Search
CPC . H01L 31/042; H01L 31/02; H01L 31/02002; H01L 31/02008; H01L 31/02016; H01L 31/02021; B64G 1/42; B64G 1/44; B64G 1/443

USPC .......................................... 136/244, 292, 293
See application file for complete search history.

(56) References Cited

U.S. PATENT DOCUMENTS 6,350,944 B1  2/2002  Sherif et al.
6,509,712 B1  1/2003  Landis
(Continued)

FOREIGN PATENT DOCUMENTS

JP  03-153132  1/1991
JP  03153132   1/1991
(Continued)

OTHER PUBLICATIONS

Lin, Xue, et al., "Near-Optical, Dynamic Module Reconfiguration in a Photovoltaic System to Combat Partial Shading Effects", 49th Design Automation Conference (DAC), ACM/EDAC/IEEE, Jun. 3-7, 2012, (pp. 516-521).

(Continued)

*Primary Examiner* — Susan D Leong
(74) *Attorney, Agent, or Firm* — Aman Talwar

(57) ABSTRACT

A PV system composed of sub-arrays, each having a group of PV cells that are electrically connected to each other. A power management circuit for each sub-array has a communications interface and serves to connect or disconnect the sub-array to a programmable power grid. The power grid has bus rows and bus columns. A bus management circuit is positioned at a respective junction of a bus column and a bus row and is programmable through its communication interface to connect or disconnect a power path in the grid. As a result, selected sub-arrays are connected by selected power paths to be in parallel so as to produce a low system voltage, and, alternately in series so as to produce a high system voltage that is greater than the low voltage by at least a factor of ten.

20 Claims, 8 Drawing Sheets

(51) Int. Cl.
  *H01L 31/042* (2014.01)
  *H02J 7/35* (2006.01)

(56) References Cited

U.S. PATENT DOCUMENTS

| | | | |
|---|---|---|---|
| 8,115,340 B2 | 2/2012 | Takehara et al. | |
| 2004/0104460 A1* | 6/2004 | Stark | B81B 7/0067 257/678 |
| 2009/0103925 A1 | 4/2009 | Alpert | |
| 2011/0101787 A1 | 5/2011 | Gaul | |
| 2012/0004780 A1 | 1/2012 | Miller et al. | |
| 2012/0043818 A1 | 2/2012 | Stratakos et al. | |

FOREIGN PATENT DOCUMENTS

| | | |
|---|---|---|
| JP | 2012516568 | 7/2012 |
| WO | 2010087804 | 8/2010 |
| WO | WO 2010/096709 A2 | 8/2010 |
| WO | 2011084545 | 7/2011 |
| WO | 2012024538 | 2/2012 |

OTHER PUBLICATIONS

Shimizu, Toshhisa, et al., "Generation Control Circuit for Photovoltaic Modules", IEEE Transactions on Power Electronics, vol. 16, No. 3, May 2011, (pp. 293-300).

Wang, Yanzhi, et al., "Enhancing Efficiency and Robustness of a Photovoltaic Power System under Partial Shading", 13th International Symposium on Quality Electronic Design (ISQED), Mar. 19-21, 2012, (9 pages).

PCT International Search Report dated Jan. 23, 2014 for PCT/US2013/057589 (Sandia Corporation, Applicant).

Office Action mailed Feb. 4, 2016 in related Japanese Patent Application No. 2015-530103 (Japanese language).

Office Action mailed Feb. 4, 2016 in related Japanese Patent Application No. 2015-530103 (English language translation).

\* cited by examiner

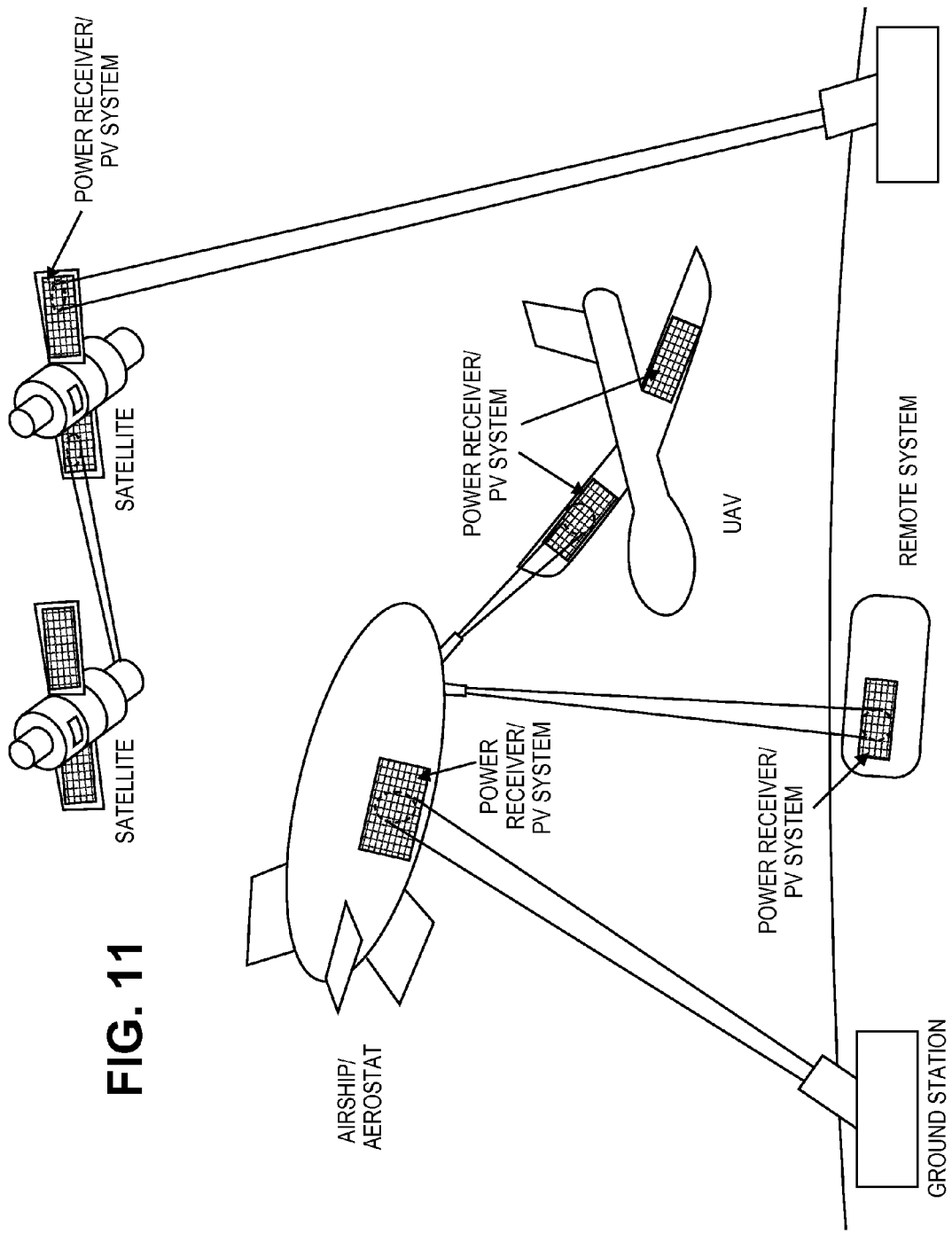

DYNAMICALLY RECONFIGURABLE PHOTOVOLTAIC SYSTEM

CROSS-REFERENCE TO RELATED APPLICATION

This non-provisional application claims the benefit of the earlier filing date of U.S. Provisional Application No. 61/695,884, filed Aug. 31, 2012.

STATEMENT OF GOVERNMENT RIGHTS

This invention was developed under Contract DE-AC04-94AL85000 between Sandia Corporation and the U.S. Department of Energy. The U.S. Government has certain rights in this invention.

FIELD

An embodiment of the invention relates to energy harvesting photovoltaic (PV) power systems such as those used in spacecraft. Other embodiments are also described.

BACKGROUND

Energy harvesting PV power systems, also referred to as solar power systems, have been used to provide electric power in various applications including residences and airborne and space borne aircraft such as satellites and unmanned aerial vehicles. For residential applications, a solar panel has a relatively small number of cells where each cell is quite large, such as a silicon PV cell that may be about six inches by six inches in area, and there may be approximately 72 such cells within in a single residential solar panel. Each solar cell typically is designed to produce a certain voltage, for example, about 0.6 volts for silicon cells, which has only a weak dependence on the amount of light radiation received at the cell. Such cells may be electrically connected in series within a panel, in order to increase the harvested energy output voltage for example, 40 Volts dc (Vdc). A typical residential solar system may include several such panels, for example between five and ten, providing up to several hundred volts. A dc-ac conversion circuit is then used to obtain the more common 120 Vac output voltage.

For airborne and spacecraft applications, a PV system is used as a primary power system that feeds energy storage devices such as a battery, as well as other components of the aircraft or spacecraft such as the propulsion system. While the battery may have a relatively low voltage of less than five volts, the propulsion system may need several hundred volts at its power supply input. Accordingly, a dc-dc up converter or voltage boost circuit is used to increase, for example, a 40-volt PV output to 800 or even 1000 volts. For space applications or unmanned aerial vehicle applications, it can be seen that a power supply bus is needed that can support low, medium and high voltages depending upon the operational mode of the spacecraft or aircraft. For example, a high voltage is needed for acceleration by the propulsion unit of a satellite during orbital transfers and other maneuvers, whereas a medium voltage is needed for regular operations, and a low voltage is needed for riding out a solar storm or a safe shutdown mode. In addition, reliability, availability and maintenance needs of the spacecraft or aircraft strongly impact the design of the electrical power system, which is a critical component in such applications.

SUMMARY

An embodiment of the invention is a dynamically reconfigurable energy harvesting photovoltaic (PV) system that can produce both a low voltage and alternately a high voltage, at the same harvested energy output node, where the high voltage may be greater than the low voltage by at least a factor of ten. This aspect of the invention may help reduce the need for a separate voltage boost converter, which will help improve power efficiency in applications such as a satellite where heat dissipation may be a difficult problem. In addition, configurability enables a more efficient power receiver in cases where the incident light on the PV system is a laser beam or incoherent, not-broadband light beam from a remote source, as opposed to sunlight. When a light beam or spot "wanders" over the PV system such that a given group of cells is not illuminated continuously, it is difficult to harvest energy efficiently. An embodiment of the invention is a PV system that can adapt itself to produce a predetermined output voltage or output power level regardless of a wandering light spot.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIG. 11 illustrates various applications of the photovoltaic system.

DETAILED DESCRIPTION

Several embodiments of the invention with reference to the appended drawings are now explained. Whenever the shapes, relative positions and other aspects of the parts described below are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
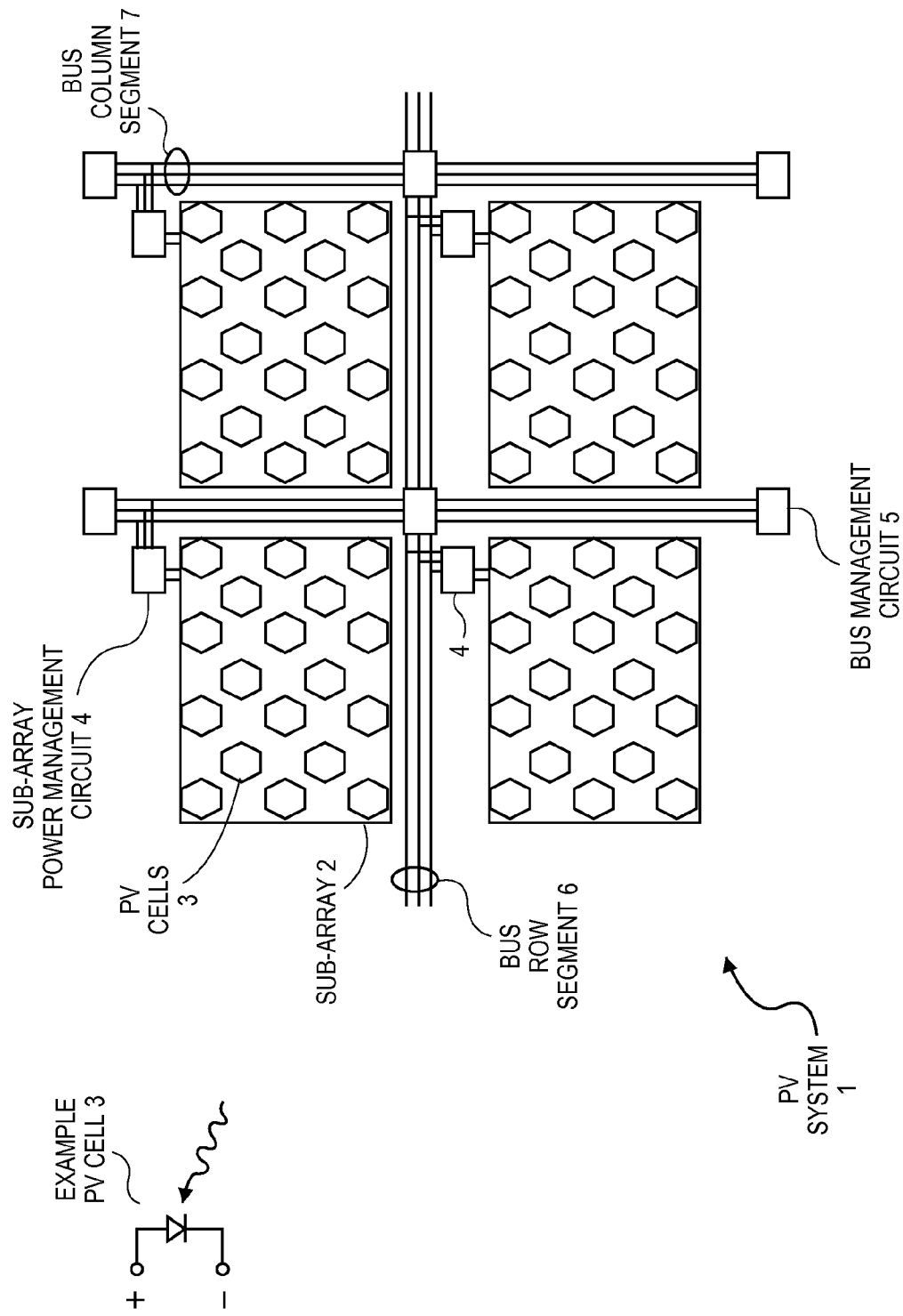
FIG. 1 depicts a reconfigurable photovoltaic system.
Figure 4:
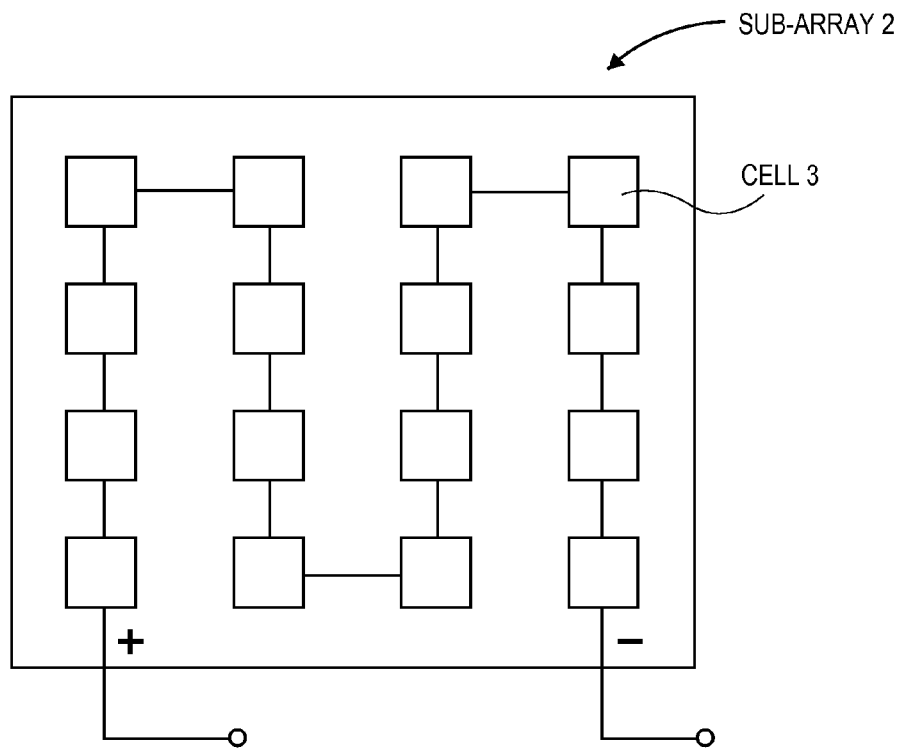
FIG. 4 shows a sub-array in which the cells are series-connected to each other.
Figure 5:
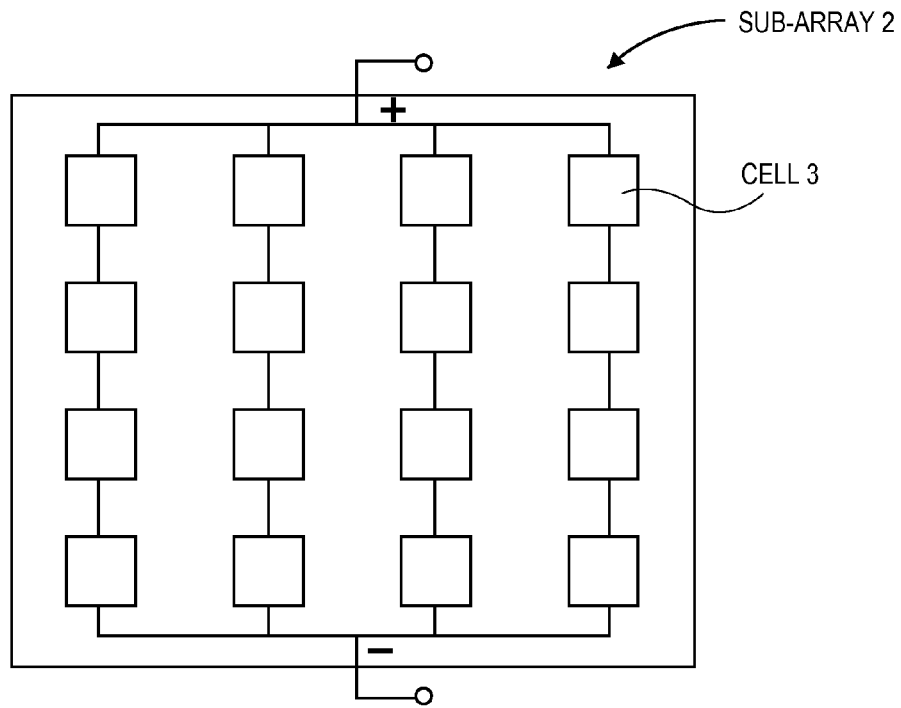
FIG. 5 shows a sub-array in which the cells are connected to each in a combined series-parallel fashion.

FIG. 1 depicts a reconfigurable PV system 1 in accordance with an embodiment of the invention. The system is composed of a number of PV energy harvesting sub-arrays 2. Although only four are shown, the system is of course not limited to that number as there may be as few as two sub-arrays 2 or there can be greater than four. Each sub-array 2 contains a group of PV cells 3 that are electrically connected to each other in series for a desired higher output voltage (see FIG. 4), in parallel for a desired increased current, or in a series-parallel combination to yield both higher output voltage and higher current (see FIG. 5). Mixed or non-symmetrical arrangements of parallel connected series strings of cells are also possible. The cell 3 may be a microsystem enabled photovoltaic (MEPV) cell that can be manufactured using semiconductor microelectronic fabrication techniques and be may relatively small, e.g., between 100 microns and 5 mm in diameter, and as low as 1 micron in thickness such as in a III-V semiconductor cell. Given the small size of the MEPV cell, the sub-array 2 can have thousands of cells 3 (in contrast to the 72 cells in a conventional PV module). Note also that not all of the cells 3 in a sub-array 3 need be replicates or even of the same type. For example, some may be silicon others may be Ge or III-V cells. The cell 3 may alternatively be a multi-junction cell that has a combination of two or more junctions that may be connected in series or, as described below in accordance with an embodiment of the invention depicted in FIGS. 7-8. For example, each of the sub-arrays 2 may be composed of photocells each of which has an active or light detection area that is less than five (5) square millimeters in area, and wherein each of the sub-arrays 2 may have several thousand of MEPV photocells and may produce between 1 volt (e.g., two Si silicon cells in series) and 1000 volts dc, with currents in the range 1 uAmpere to several Amperes, uAmperes for applications where only high voltage and low or essentially no current is needed (electron/ion acceleration grids, for example), and several Amperes for high current draw applications (e.g., thermal loads, etc.) it would be possible to transfer mW to kW of power using the power transfer configuration described here.

Figure 2:
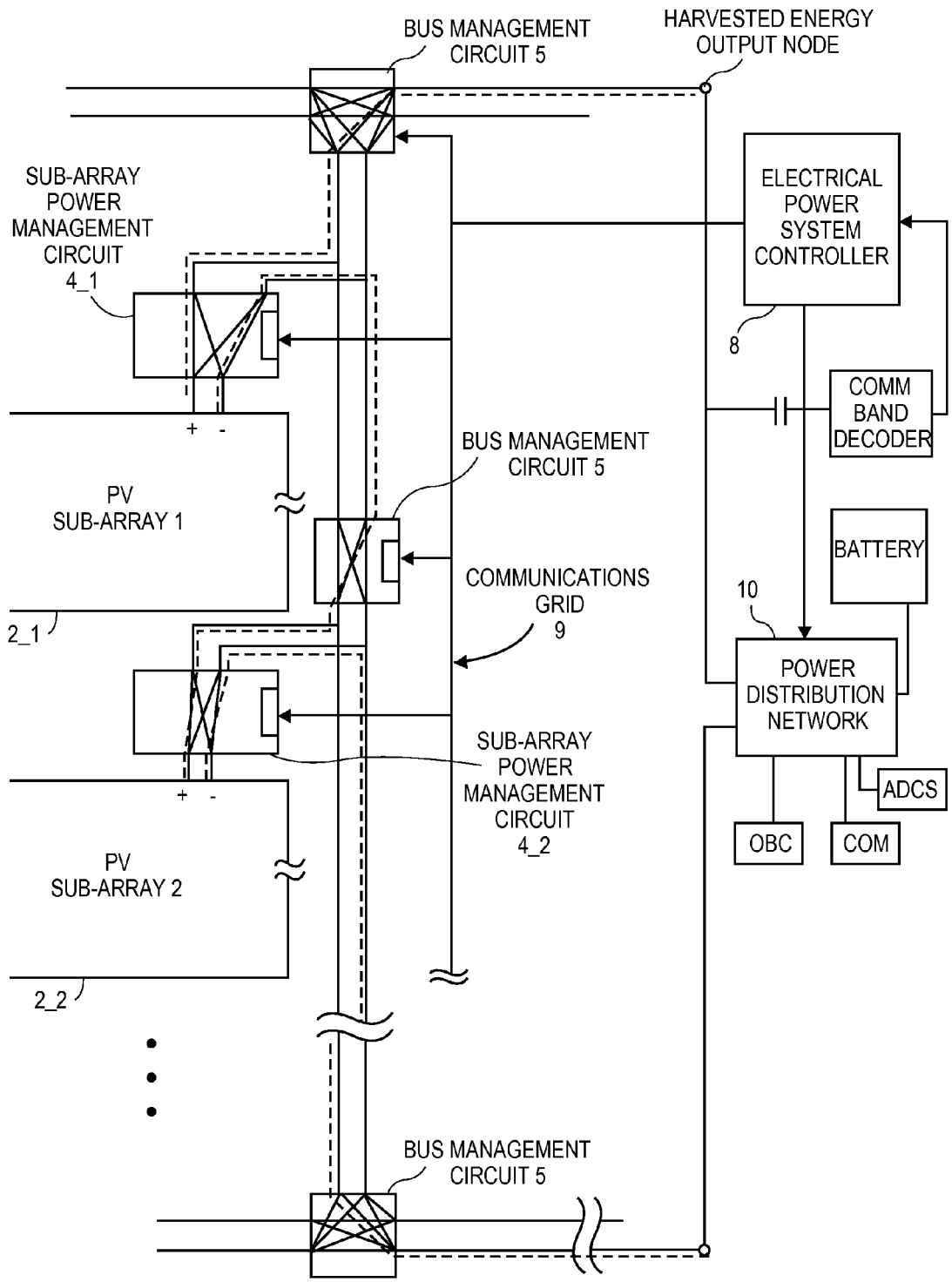
FIG. 2 shows a more detailed view of the photovoltaic system in one configuration, as part of a spacecraft application.

Still referring to FIG. 1, in the presence of incident light, a sub-array output voltage is produced by each sub-array 2, from its connected cells 3, at a respective pair of sub-array power nodes. These are sometimes designated with the labels (+) and (−) to indicate the polarity of the output voltage. The output voltage and current or output power of the sub-array is delivered by a distributed network of conductors and active circuits referred to here as a power grid. The power grid (or power bus interconnect) is composed of multiple bus rows and multiple bus columns. As can be seen, a bus management circuit 5 is positioned at a respective junction of a bus column and a bus row. Each bus row has a respective number of bus group row segments 6 that are coupled in a daisy chain manner, or forming a sequence, by some of the bus management circuits 5. Similarly, each bus column has a respective number of bus group column segments 7 that are also coupled in a daisy chain manner, by some of the bus management circuits 5. Each bus group segment (row segment 6 or column segment 7) has a respective number of bus conductors. In one example, each bus group segment has two bus conductors, as seen in FIG. 2 and in FIG. 3, although additional conductors may be added in parallel, for example, to reduce electrical resistance. In such a power grid, each bus management circuit 5 may be coupled to between two and four adjacent bus group segments, namely left and right bus group row segments 6, and upper and lower bus group columns segments 7.

Coupled to each pair of sub-array output power nodes is the input of a respective sub-array power management circuit 4. The circuit 4 also has a power output that is coupled to the power grid, i.e., to either a row segment 6 or a column segment 7. In one embodiment, the current path switches in each sub-array power management circuit 4 support a "mesh network" in that they can connect any of the input nodes of the circuit 4 with any of its output nodes. The circuit 4 also has a communications interface, which is not shown in FIG. 1 but can be seen in FIG. 2 where it is coupled to a communications grid 9. The communications grid 9 to which the communications interfaces of the power management circuits 4 and bus management circuits 5 are coupled may be any suitable, relative low complexity and low bit rate digital communications bus. This communication interface could be optical in nature with the information passed to the power management circuit through a signal encoded on the light that is illuminating the sub-arrays and that is decoded by a communications band decoder—see FIG. 2 described below.

The sub-array power management circuit 4 contains circuitry including solid state current path switches, switch drivers, control logic, and communications interface circuitry that enables it to be programmable (through its communication interface) during in-the-field use of the PV system, to either connect or disconnect its respective sub-array 2 to the power grid. In addition to the programmable sub-array power management circuits 4, each of the bus management circuits 5 is also programmable (through its communication interface) to one of connect and disconnect a power or current path in the power grid, using internal current path switches that may also support a mesh network (similar to the capability of the circuit 4 described above). Those two capabilities together enable two or more selected sub-arrays 2 to be connected, through selected current or power paths in a "programmable" power grid, in parallel so as to produce a low voltage at the harvested energy output node but at a high current. Alternately, the configurability of the sub-array power management circuits 4 and the bus management circuits 5 enable two or more selected sub-arrays 2 to be connected, via selected current paths, in series so as to produce a higher voltage that may be greater than the lower voltage by at least a factor of ten (depending upon a sufficient number of sub-arrays 2 being available for a series connection).

Referring now to FIG. 2 for additional details concerning the power grid and the sub-array power management circuits 4, FIG. 2 shows an example power path that has been created in the power grid, by appropriately programming the current path switches in selected circuits 4, 5. The example power path enables a series connection of sub-arrays 2_1, 2_2, . . . which may lie in the same column, such that the (+) harvested energy output node is a conductor of a bus row segment 6 at a top boundary of the PV system, while the (−) harvested energy output node is a conductor of a bus row segment 6 at a bottom boundary of the PV system. A bus management circuit 5 that is not at the boundary of the PV system can be programmed to alternately connect and disconnect to each other a) a bus conductor from any one of its four adjacent bus group segments and b) a bus conductor from any other one of its four adjacent bus group segments, providing maximum flexibility in defining a power path.

For the example of FIG. 2, it can be seen that additional columns of sub-arrays can be connected to each other in series similar to the one in FIG. 2. If these additional series-connected columns happen to be adjacent to another, then all of these columns can also be connected to each other in parallel, along the top and bottom rows of the PV system, by programming the bus management circuit 5 that is at the boundary, to create a further current path from its left bus row segment 6 to its lower bus column segment 7.

Figure 3:
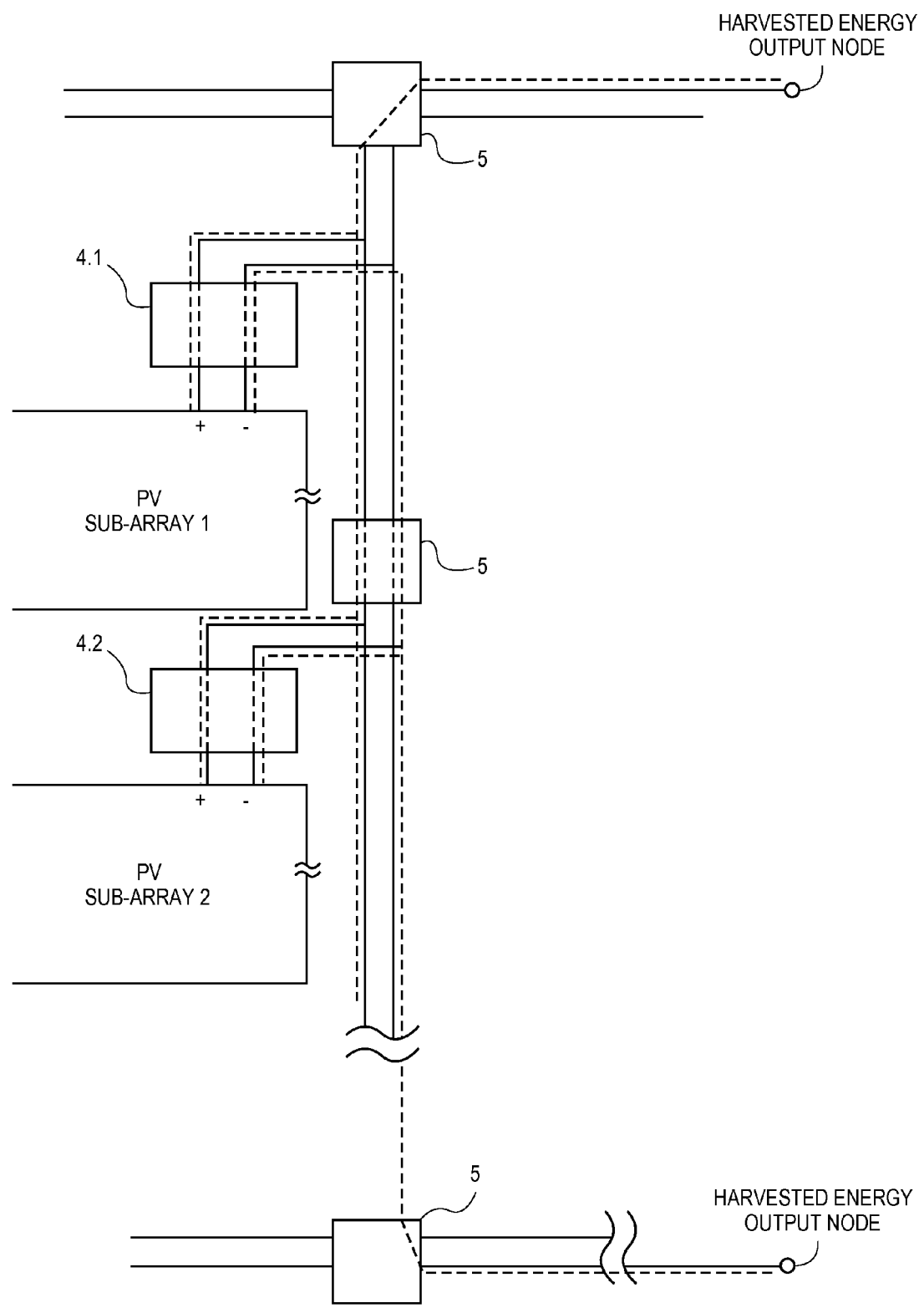
FIG. 3 shows the reconfigurable photovoltaic system in another configuration.

The power grid of FIG. 2 can be reconfigured so that power paths are created therein that enable a parallel, rather than a series, connection of the sub-arrays 2_1, 2_2, . . . This is depicted in the example of FIG. 3. If additional current is desired, then additional parallel-connected columns of sub-arrays can be created, and these may be placed in parallel with each other by suitably programming the bus management circuits 5 at the top and bottom boundaries of the PV system.

It should be noted that while the full mesh capability of the internal current path switches of the circuits 4, 5 described above can provide the greatest flexibility in creating power paths in the power gird and between sub-arrays, an alternative is to restrict the number of current path switches so that the circuit 4 or 5 has less than a full mesh capability. This may be acceptable so long as the desired power paths can be created in the power grid, and a desired level of granularity of the configurability of the PV system as a whole, including granularity of the connections between sub-arrays, can be met.

Still referring to FIG. 2, in accordance with another embodiment of the invention, the remote light beam source can encode power transfer configuration instructions or other data (e.g., instructions for controlling the power system configuration or other sub-system such as the ADCS, COM, etc.) by imposing a high frequency component onto the light beam. That information is then detected through an electrical node that is capacitively coupled to the PV cells, while the DC component is being harvested for power. An example is shown in FIG. 2 where the ac signal can be out-coupled through a series capacitor connected to the harvested energy output node, to a communications band decoder. The latter translates or decodes the information or data signal for use by the EPS controller for example, to use in configuring the power management circuits and/or determining for example that the incident light is a remotely sourced light beam, rather than sunlight, and/or for controlling other sub-systems.

Figure 6:
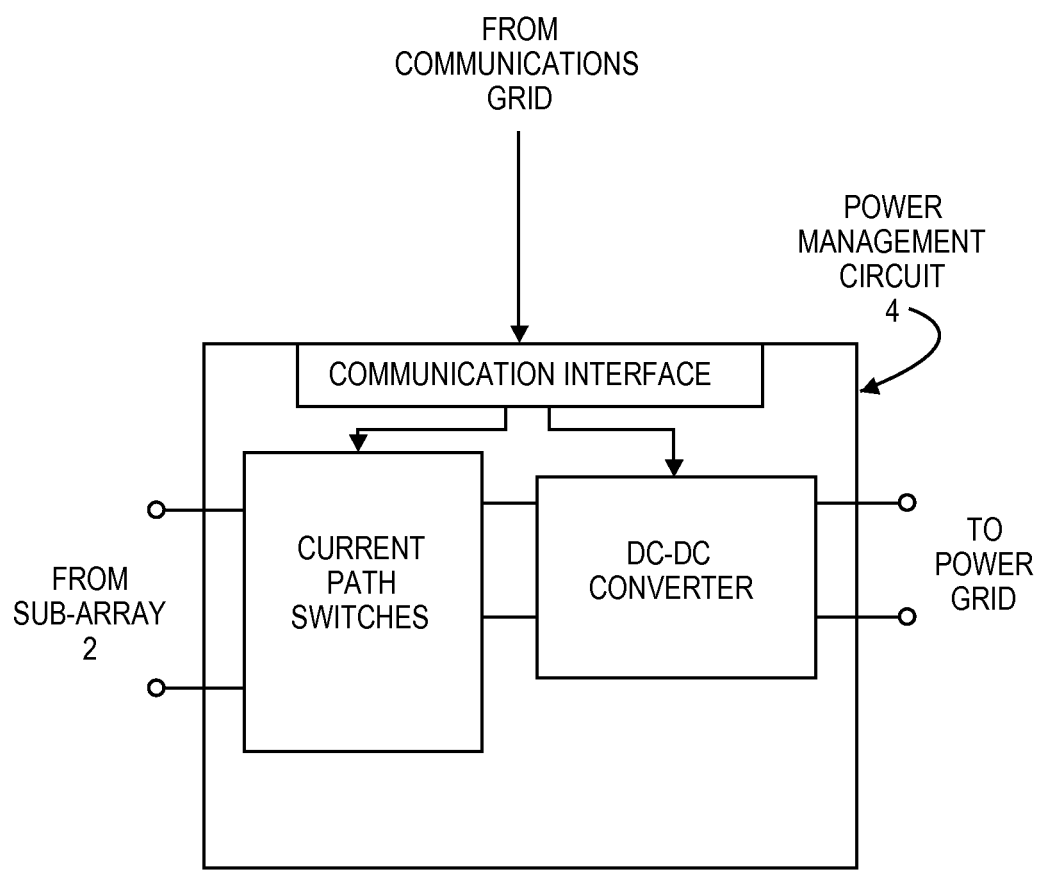
FIG. 6 depicts a sub-array power management circuit having a dc-dc converter.

Turning now to FIG. 6, a sub-array power management circuit 4 is depicted that has a dc-dc converter coupled between the sub-array output nodes (of its associated sub-array 2) and the power grid. Note that in this particular example, the current path switches (that serve to alternately connect and disconnect the sub-array 2 to the power grid) are "in front" of the dc-dc converter circuitry, so that when the sub-array 2 is disconnected from the grid, the dc-dc converter automatically sees essentially Volts at its input. While it is possible to allow the dc-dc converter to also be controlled through the communications grid 9 (as shown here via the communication interface of the circuit 4), for example as to how much to boost the output voltage or at what voltage to regulate, this is not needed in all instances because a fixed boost or regulated voltage may be set. Using the dc-dc converter as a boost converter, the PV system can provide a boosted output voltage at its harvested energy output nodes, while advantageously distributing the task of dissipating the heat produced by the overall boost conversion process, to the various locations of the sub-arrays (rather than to a centralized location outside the PV system). The use of a dc-dc converter in this manner may be viewed as an alternative to the embodiment described above where a sufficient number of sub-arrays 2 are connected in series (by appropriately configuring the power paths in the power grid) in order to produce a high output voltage, or it may be used in conjunction with the series configuration of FIG. 2, for example, so as to obtain the highest available voltage from the PV system (as the sum of the output voltages of a number of sub-array power management circuits 4 that also have boost converters as depicted in FIG. 6).

Returning briefly to FIG. 2, this figure also serves to illustrate another embodiment of the invention, namely a specific application or integration of a dynamically reconfigurable PV system in a spacecraft. In such an application, the spacecraft has an electrical power system (EPS), which includes (in addition to the PV system) a controller 8 and a power distribution network 10. The EPS distributes power from the harvested energy output nodes of the PV system to other components of the spacecraft, namely a rechargeable battery, an on-board computer (OBC), a communications subsystem (COM), and an attitude determination and control system (ACDS). As suggested above, this may call for low, medium and high voltages to be alternately available on the harvested energy output nodes dynamically, i.e. during normal use or deployment of the satellite. The reconfigurable PV system described above may meet such requirements, when the EPS controller 8 has been programmed to configure the power and bus management circuits 4,5 via the communications grid 9, to set the high or low voltage at the harvested energy output node.

Figure 7:
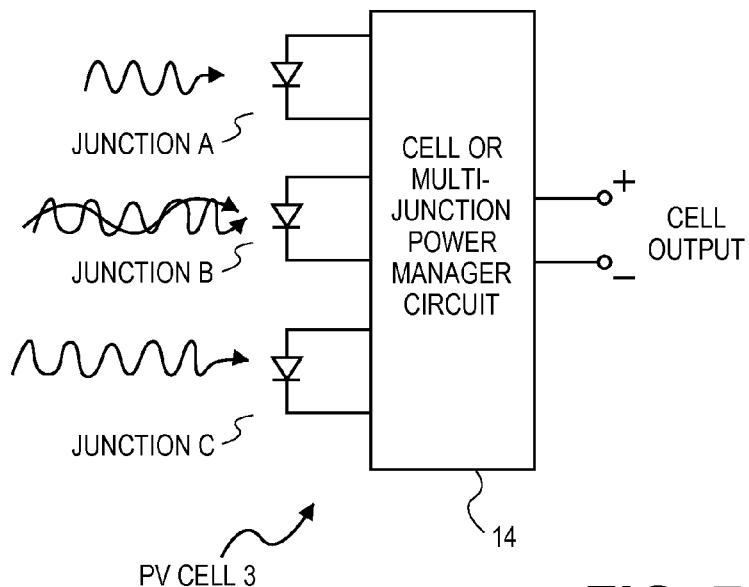
FIG. 7 depicts a cell or multi-junction power manager circuit, in block diagram form.

Turning now to FIG. 7, this figure depicts an embodiment of the invention where the PV cell 3 is a multi-junction cell, and a cell-level or multi-junction power manager circuit 14 is provided for each such cell, to produce the cell output voltage. As was suggested earlier, one or more of the cells in each sub-array 2 may be multi-junction cells, wherein each multi-junction cell has two or more junctions (e.g., p-n junctions) for collecting the photo-generated current, and wherein each of the junctions is independently coupled to the multi-junction power manager circuit 14. The different junctions (the example here referring to three junctions A, B, and C) may each be tuned or optimized to produce the most electricity when absorbing a different color or wavelength of light. Each of the photocell junctions that make up a multi-junction PV cell is coupled to a separate input port of the power manager circuit 14 associated with that multi-junction PV cell. As such, the energy harvested by every one of the photocell junctions is provided to the power grid through the same output port of the power management circuit 14. The power manager circuit 14 which is managing the power coming from the different junctions within the multi-junction cells could manage power coming from a single junction or an aggregate of similar junctions, within a sub-array of multi-junction cells. It also should be noted that a single element within a multi-junction cell could be either a single junction or perhaps a subset or multiple being two (or more) junctions connected, for example, in series to make one element of a larger, for example, six-junction multi-junction cell. As another example of a multi-junction cell, consider one that has a total of five junctions, where various subsets of the junctions are independently coupled to a multi-junction power manager circuit 14. For instance, such a 5-junction cell can be arranged as follows: a 2-junction sub-cell connected separately (to the circuit 14) from a 1 junction sub-cell and another 2-junction sub-cell. Other arrangements of multi-junction cells that may have series and/or parallel connected subsets, i.e. connected to its respective power manager circuit 14, are possible.

Figure 8:
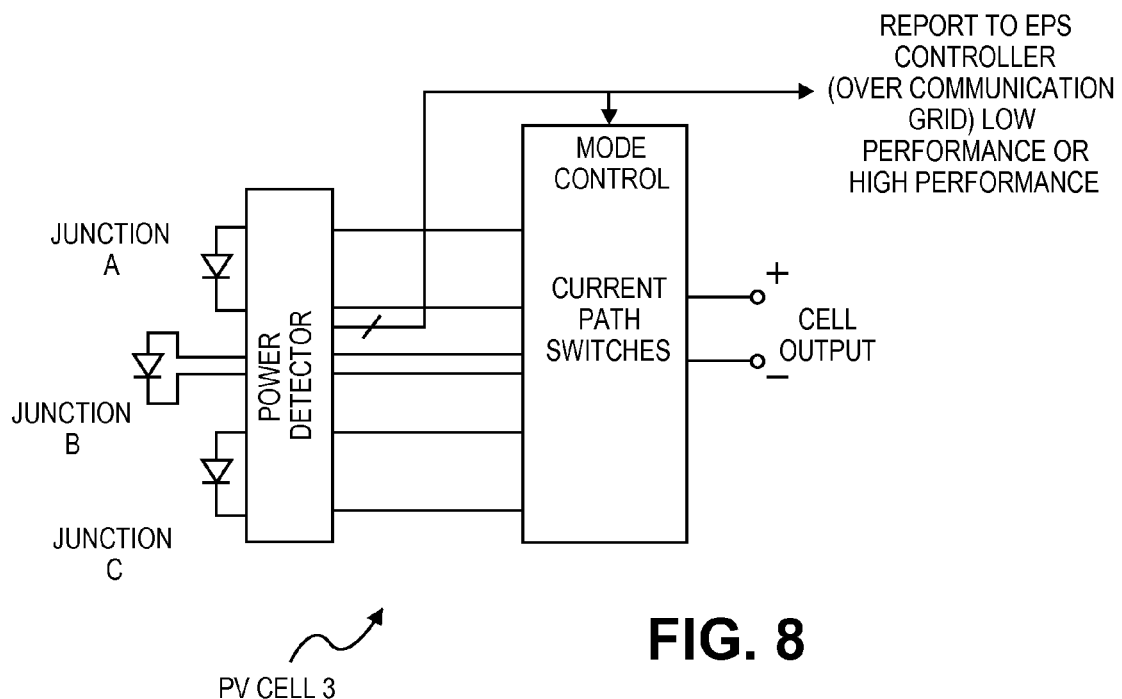
FIG. 8 depicts a photovoltaic cell with an associated cell or multi-junction power manager circuit in greater detail.

In one embodiment, referring now to FIG. 8, the power manager circuit 14 may be composed of a power detection circuit that serves to detect some measure of the relative power being produced at any given time by the junctions A, B, and C. For example, the detector may be designed to automatically detect which one or more of the junctions are producing the lowest power. In response to such a determination, the PV cell 3, and in particular its power manager circuit 14, will operate in a predetermined mode. As an example, that mode may be one where control signals are asserted to configure the current path switches so that the junctions producing the lowest power become disconnected from the cell output port.

In another example, the detector may be designed to automatically detect which one or more of the junctions are producing the highest power, in response to which the cell 3 will operate in a different predetermined mode. As an example, that mode may be one where control signals are asserted to configure the current path switches so that only the junctions producing the highest power become connected in series with the cell output port. In another embodiment, the cell or multi-junction power manager circuit 14 has a communication interface through which it can be programmed (via the communication grid 9) so as to connect the photocell junctions, which make up its associated multi-junction PV cell or group of such multi-junction PV cells, either a) all in parallel with each other, b) all in series with each other, or c) in some series-parallel combination.

It should be noted that the cell or multi-junction power manager circuit 14 and its associated multi-junction PV cell 3 could be implemented on the same microelectronic or integrated circuit substrate.

Figure 9:
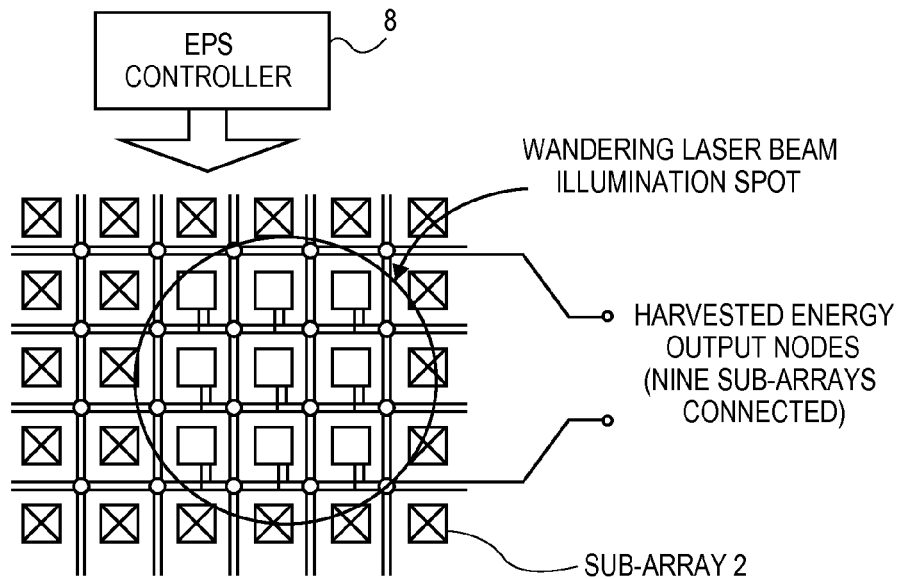
FIG. 9 shows how a wandering laser or incoherent light beam spot covers connected sub-arrays, while other sub-arrays outside the spot are disconnected.
Figure 10:
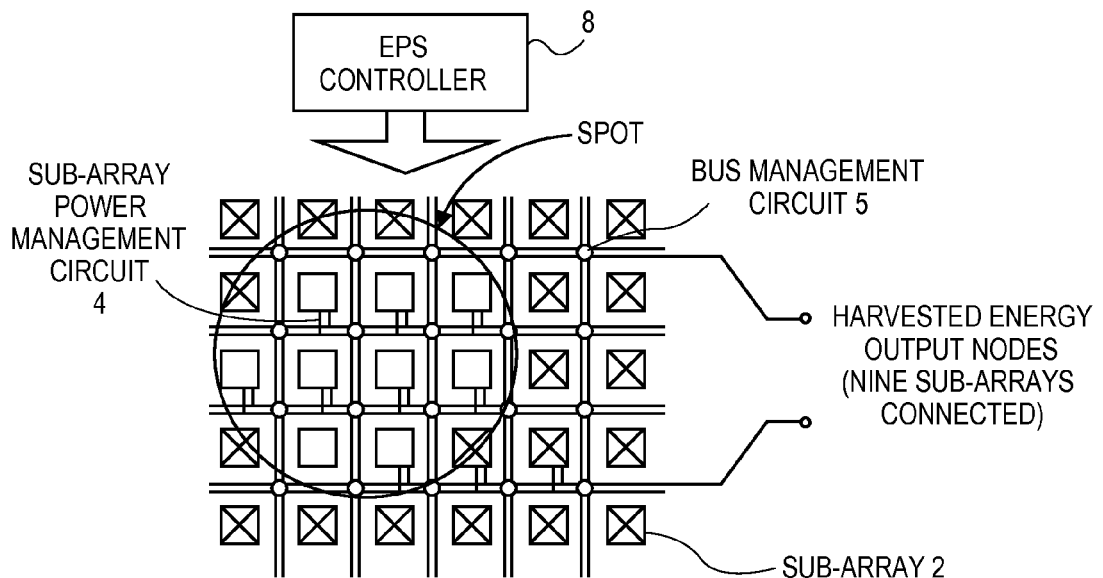
FIG. 10 shows the wandering light beam spot in a different location on the photovoltaic system.

Referring now to FIG. 9 and to FIG. 10, these figures are used to illustrate another embodiment of the invention, where the PV system can maintain a predetermined system output voltage or system output power level despite the presence of a wandering laser light beam or incoherent light beam illumination spot. A similarly beneficial result may be obtained in situations where there is a partial shading of the sub-arrays 2. The PV system depicted here is being illuminated with a laser or incoherent beam (not sunlight), or can be viewed as being shaded outside the illumination spot. Examples of these circumstances are given in FIG. 11 where remote power transfer is occurring to a power receiver or PV system of an aircraft or spacecraft, via a remotely produced light beam that is being aimed at the sub-arrays 2. To maintain efficiency, the beam spot should be no larger than the area of the sub-arrays 2 of the PV system. In fact, the spot should be smaller than the full area of coverage of the sub-arrays 2 (as shown by the example) to allow for adequate misalignment tolerance between the remote light beam source and the PV array. In traditional PV systems, illuminating less than the full area of the PV array leads to reduced performance and possibly damage to the array. However, an embodiment of the invention can accept a laser (or other light) spot size that is less than the full area of the PV array. This illumination situation will yield some low performing sub-arrays 2 outside the spot, and some high performing sub-arrays 2 inside the spot. Now, the EPS controller 8 programs the power manager circuits 14 of the low performing sub-arrays to disconnect them from the power grid, in response to, for example, a signal from the power detector (see FIG. 8) that is associated with a multi-junction cell in each of those sub-arrays that indicates low performance by a multi-junction cell in the sub-array. Alternatively, the power manager circuit 14 could have a DC-DC voltage boost converter that allows the partially illuminated or low performing sub-arrays to connect with the power grid, at the appropriate voltage. The power situation would need to be one where the power output from that circuit 14 doesn't need to match the grid power, but its voltage output level does need to match, for the sub-array to be connected to the power grid. In addition, the EPS controller programs the power manager circuits 14 of high performing sub-arrays to connect them to the power grid, in response to a signal from the power detector associated with a multi-junction cell in each of those sub-arrays that indicates high performance by a multi-junction cell in the sub-array.

In another embodiment, the EPS controller 8 signals each of the power manager circuits 14 to connect their photocell junctions in series with each other in response to a determination that the PV system is most likely feeing sufficient sunlight, so that efficient energy harvesting can be performed when the current characteristics of the different junctions sufficiently match during sunlight. But when it is determined that energy harvesting is based on a laser light beam or an incoherent light beam (not sunlight), then the process described below can be performed to disconnect the junctions that are not optimized for the color or wavelength of the light beam, and also to track the wandering beam spot so that an optimal selection of a subset of the sub-arrays is always being made (consistent with the coverage area of the beam spot).

A method for operating an energy harvesting photovoltaic (PV) system having energy harvesting sub-arrays, cell power management circuits, sub-array power management circuits, and a programmable power grid, may proceed as follows (with references being made also to FIG. 9 and FIG. 10). A number of performance indications are received (e.g., by the EPS controller 8) from certain cell power manager circuits 14, respectively (see also FIG. 7 and FIG. 8). The controller 8 then signals the power manager circuits 14 of low performing sub-arrays to disconnect those sub-arrays from the power grid. In addition, the controller signals the circuits 14 of high performing sub-arrays to connect those sub-arrays to the power grid. Also, the controller 8 signals the bus management circuits 5 (see FIG. 1, and also FIG. 2 and FIG. 3) to form power paths in the power grid, from the connected sub-arrays to the pair of harvested energy output nodes of the PV system 1, based on the received performance indications. This may be designed to achieve a predetermined system output voltage or system output power level.

Next, while the beam spot wanders over the PV system 1, the operations in the previous paragraph are automatically being repeated by the controller 8 upon the power grid so as to strive to maintain the predetermined system output voltage or power level, by making changes or updates such that only well-illuminated sub-arrays remain connected to the power grid.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. For example, although in FIG. 2 and in FIG. 3 the harvested energy output nodes are selected to be located at the top and bottom boundaries of the PV system's power grid, they could alternatively be located at the left and right boundaries. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

We claim:

1. A dynamically reconfigurable energy harvesting photovoltaic (PV) system comprising:
    a plurality of PV energy harvesting sub-arrays wherein each sub-array comprises a group of photovoltaic cells that are electrically connected to each other to generate a voltage at a respective one of a plurality of pairs of sub-array power nodes;
    a plurality of power management circuits each having a power input that is coupled to a respective one of the pairs of sub-array power nodes and a communications interface; and
    a programmable power grid to which a power output of each of the power management circuits is coupled, the power grid having a plurality of bus rows, a plurality of bus columns, a plurality of bus management circuits each being positioned at a respective junction of a bus column and a bus row, and a harvested energy output node,
    wherein each power management circuit is programmable through its communication interface during in-the-field use of the PV system to one of connect and disconnect its respective sub-array to the grid, and each bus management circuit is programmable through its communication interface to one of connect and disconnect a power path in the grid, so that selected sub-arrays are connected by selected power paths to be in parallel so as to produce a low voltage at the harvested energy output node, and, alternately, selected sub-arrays of the system are connected by selected power paths to be in series so as to produce a high voltage that is greater than the low voltage by at least a factor of ten.

2. The system of claim 1 wherein each bus row has a respective plurality of bus group segments that are coupled in a daisy chain manner by some of the bus management circuits, and
    wherein each bus column has a respective plurality of bus group segments that are coupled in a daisy chain manner by some of the bus management circuits,
    each bus group segment having a respective plurality of bus conductors.

3. The system of claim 2 wherein each bus management circuit is coupled to four adjacent bus group segments, and can be programmed to alternately connect and disconnect to each other a) a bus conductor from one of the four adjacent bus group segments and b) a bus conductor from another one of the four adjacent bus group segments.

4. The system of claim 1 wherein each of the power management circuits has a dc-dc converter coupled between the power input of the bus management circuit and the power grid.

5. The system of claim 1 wherein some of the cells in each sub-array are multi junction cells, wherein each multi junction cell has a plurality of junctions, wherein each of the junctions, or at least one subset of said junctions is independently coupled to a multi-junction power manager circuit associated with the multi junction cell, the system further comprising
    an electrical power system controller that is to program the power management circuits of low performing sub-arrays to one of a) disconnect the sub-arrays from the power grid in response to a signal from a multi junction power manager circuit associated with a multi junction cell in each of the sub-arrays that indicates low performance of a multi junction cell in the sub-array, and b) where the multi junction power manager circuit comprises a dc-dc boost voltage converter, connect the low-performing sub-arrays to the power grid through the boost voltage converter,
    wherein the controller is to program the power management circuits of high performing sub-arrays to connect the sub-arrays to the power grid in response to a signal from a multi-junction power management circuit associated with a multi junction cell in each of the sub-arrays that indicates high performance of a multi junction cell in the sub-array.

6. The system of claim 1 further comprising:
    a communications grid to which the communications interfaces of the power management circuits and bus management circuits are coupled; and
    an electrical power system controller that is to program the power and bus management circuits, via the communications grid, to set the high or low voltage at the harvested energy output node.

7. The system of claim 1 wherein each of the sub-arrays is composed of photocells each of which has an active or light detection area that is less than five (5) square millimeters in area, and wherein each of the sub-arrays has at least one thousand photocells and is to produce between 1 volt dc and 1000 volts dc.

8. The system of claim 1 further comprising a communications band decoder that is capacitively coupled to a sub-array power node, to decode information or data from a signal detected by the sub-array, wherein said information or data was embedded by a remote source of light that is illuminating the sub-array.

9. A dynamically reconfigurable energy harvesting photovoltaic (PV) system comprising:
    a plurality of sub-arrays wherein each sub-array comprises a group of photovoltaic cells that are electrically connected to each other;
    a plurality of power management circuits, wherein each power management circuit of the plurality of power management circuits having a power input that is coupled to a respective sub-array power node of a plurality of sub-array power nodes and a communications interface; and
    a programmable power grid to which a power output of each of the power management circuits is coupled, wherein the programmable power grid comprising a plurality of bus rows, a plurality of bus columns, and a plurality of bus management circuits, wherein each bus management circuit of the plurality of bus management circuits is positioned at a respective junction of a bus column of the plurality of bus columns and a bus row of the plurality of bus rows,
    wherein each power management circuit is programmable through its communication interface during in-the-field use of the PV system to one of connect or disconnect from its respective sub-array to the programmable power grid, and each bus management circuit is programmable through its communication interface to one of connect or disconnect a power path in the programmable power grid, so that selected sub-arrays are connected by selected power paths in parallel, or in series so as to produce a high voltage that is greater than a low voltage by at least a factor of ten.

10. The dynamically reconfigurable energy harvesting PV system of claim 9, wherein each bus row comprises a plurality of bus group segments that are coupled in a daisy chain manner by some of the bus management circuits of the plurality of bus management circuits.

11. The dynamically reconfigurable energy harvesting PV system of claim 9, wherein each bus column comprises a plurality of bus group segments that are coupled in a daisy chain manner by some of the bus management circuits of the plurality of bus management circuits.

12. The dynamically reconfigurable energy harvesting PV system of claim 11, wherein each bus group segment comprises a plurality of bus conductors.

13. The dynamically reconfigurable energy harvesting PV system of claim 9, wherein each power management circuit of the plurality of power management circuits has a DC-DC converter coupled between a power input of a bus management circuit of the plurality of bus management circuits and the power grid.

14. The dynamically reconfigurable energy harvesting PV system of claim 9 further comprising: a communications band decoder coupled to a sub-array power node of the plurality of sub-array power nodes.

15. The dynamically reconfigurable energy harvesting PV system of claim 9, wherein each photovoltaic cell of the group of photovoltaic cells comprises an active region that is less than 5 square millimeters.

16. A photovoltaic (PV) system comprising:
a plurality of sub-arrays;
a plurality of power management circuits, wherein each power management circuit of the plurality of power management circuits comprising a power input, wherein the power input is coupled to a sub-array power node of a plurality of sub-array power nodes and a communications interface; and
a programmable power grid to which a power output of each of the power management circuits is coupled, wherein the programmable power grid comprising a plurality of bus rows, a plurality of bus columns, and a plurality of bus management circuits, wherein each bus management circuit of the plurality of bus management circuits is positioned at a respective junction of a bus column of the plurality of bus columns and a bus row of the plurality of bus rows,
wherein each power management circuit is programmable through the communications interface to one of connect or disconnect from a respective sub-array to the programmable power grid, and each bus management circuit is programmable through the communications interface to one of connect or disconnect a power path in the programmable power grid so that selected sub-arrays are connected by selected power paths in parallel, or in series so as to produce a high voltage that is greater than a low voltage by at least a factor of ten.

17. The PV system of claim 16, wherein each sub-array of the plurality of sub-arrays comprises a group of photovoltaic cells that are electrically connected to each other.

18. The PV system of claim 17, wherein each photovoltaic cell of the group of photovoltaic cells comprises an active region that is less than 5 square millimeters.

19. The PV system of claim 16, wherein each bus row comprises a plurality of bus group segments that are coupled in a daisy chain manner by some of the bus management circuits of the plurality of bus management circuits.

20. The PV system of claim 16, wherein each bus column comprises a plurality of bus group segments that are coupled in a daisy chain manner by some of the bus management circuits of the plurality of bus management circuits.

* * * * *